(12) United States Patent
Nardone et al.

(10) Patent No.: US 8,411,492 B2
(45) Date of Patent: Apr. 2, 2013

(54) MEMORY BASE CELL AND MEMORY BANK

(75) Inventors: Valentina Nardone, Avezzano (IT); Stefano Pucillo, Paderno d'Adda (IT); Roberto Canegallo, Rimini (IT); Claudio Mucci, Bologna (IT); Massimiliano Innocenti, Urbino (IT); Luca Perugini, Lugo di Ravenna (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 0 days.

(21) Appl. No.: 13/097,502

(22) Filed: Apr. 29, 2011

(65) Prior Publication Data

US 2012/0075920 A1 Mar. 29, 2012

(30) Foreign Application Priority Data

Apr. 30, 2010 (IT) .............................. MI2010A0756

(51) Int. Cl.
*G11C 11/00* (2006.01)
*G11C 7/10* (2006.01)
*G11C 8/00* (2006.01)

(52) U.S. Cl. .................. 365/156; 365/154; 365/189.04; 365/230.05

(58) Field of Classification Search .................... 365/156
See application file for complete search history.

(56) References Cited

U.S. PATENT DOCUMENTS

| 3,964,031 A | 6/1976 | Eaton, Jr. .................... 340/173 |
| 5,353,251 A * | 10/1994 | Uratani et al. ............ 365/189.05 |
| 7,633,794 B2 * | 12/2009 | Boemler ........................ 365/154 |
| 2007/0041239 A1 | 2/2007 | Takeda .......................... 365/154 |

* cited by examiner

*Primary Examiner* — Son Mai
(74) *Attorney, Agent, or Firm* — Allen, Dyer, Doppelt, Milbrath & Gilchrist, P.A.

(57) ABSTRACT

A memory base cell stores a bit of information implemented from a regular and compact structure made up of multiple identical and replicated base elements, on the "sea of gates" model, in which the base element of the structure is a cell able to be configured with a minimum width in relation to the particular technology used. Such a cell includes a bistable element with an input node operatively connected to a writing data line of the memory base cell, and an output node operatively connected to a reading data line of the memory base cell. The bistable element also has a first inverter and a second inverter arranged in a feedback configuration with respect to one another between the input node and the output node of the bistable element.

19 Claims, 7 Drawing Sheets

MEMORY BASE CELL AND MEMORY BANK

FIELD OF THE INVENTION

The present invention directed the field of memory, and, more particularly, to an SRAM (Static Random Access Memory) memory base cell and a memory bank comprising a plurality of SRAM memory base cells based on a sea of gates type architecture.

BACKGROUND OF THE INVENTION

An SRAM memory base cell is intended to contain one bit of information and is typically implemented inside a full custom structure (designed ad-hoc) built from a basic architecture to minimize some reference parameters, the most helpful of which is the area occupied.

Such a basic cell typically comprises a group of 4 N-channel. MOS transistors and 2 P-channel MOS transistors, suitably sized to implement a "ratioed logic" in which the ability to control a given signal varies according to the size of the transistor. Such a design makes it possible to ensure the correct behavior of the cell in a variety of operating conditions and to reduce the number of transistors.

An SRAM memory base cell, since it comprises a predetermined number of basic cells adjacent to one another, is actually a structure with a predetermined number of transistors in which such transistors are configured to form a feedback circuit comprising two logic inverters the outputs of which are respectively connected to the writing line and to the reading line of the data of the SRAM memory base cell, through respective pass transistors.

Currently, in the design and manufacture of integrated circuits, in which a memory base cell like the one described earlier represents one of the fundamental elements, there is a great desire to satisfy increasingly taxing requirements such as the increase in efficiency and ease of production of integrated circuits, high reliability, high regularity of design, increased performance in terms of reduction of the area occupied, flexibility of use in different applications (automotive, wireless, consumer), and so on.

Achieving each of the aforementioned desires also entails a reduction in design and manufacturing costs of such integrated circuits. A memory bank comprising SRAM memory base cells like the one described earlier represents one of the fundamental elements that can be included in an integrated circuit. Therefore, the desires indicated above also apply to the single memory base cell contained in a respective memory bank.

SUMMARY OF THE INVENTION

The purpose of the present invention is to provide an alternative memory base cell to that of the prior art described above that has high flexibility, high regularity and relatively low area occupation.

Therefore, a memory base cell for storing one bit of information may include a bistable element comprising an input node operatively connected to a writing data line of the memory base cell and an output node operatively connected to a reading data line of the memory base cell. The bistable element may also comprise a first inverter and a second inverter arranged in feedback configuration with respect to one another between the input node and the output node of the bistable element. An input transfer element may be operatively connected between the writing data line of the memory base cell and the input node of the bistable element to transfer one bit of information from the writing data line to the bistable element.

The input transfer element may be equipped with a first control terminal to receive a writing enabling logic signal, and a further control terminal to receive the writing enabling denied logic signal. The second inverter of the bistable element may include a first writing enabling terminal to receive the writing enabling logic signal and a second writing enabling terminal to receive the writing enabling denied logic signal so that the second inverter of the bistable element is disabled for writing when the input transfer element is enabled for writing the bit of information.

BRIEF DESCRIPTION OF THE DRAWINGS

Further characteristics and advantages of the memory base cell according to the invention shall become clear from the following description of preferred example embodiments, given for indicating and not limiting purposes, with reference to the attached figures, in which.

DETAILED DESCRIPTION OF THE PREFERRED EMBODIMENTS

Figure 1:
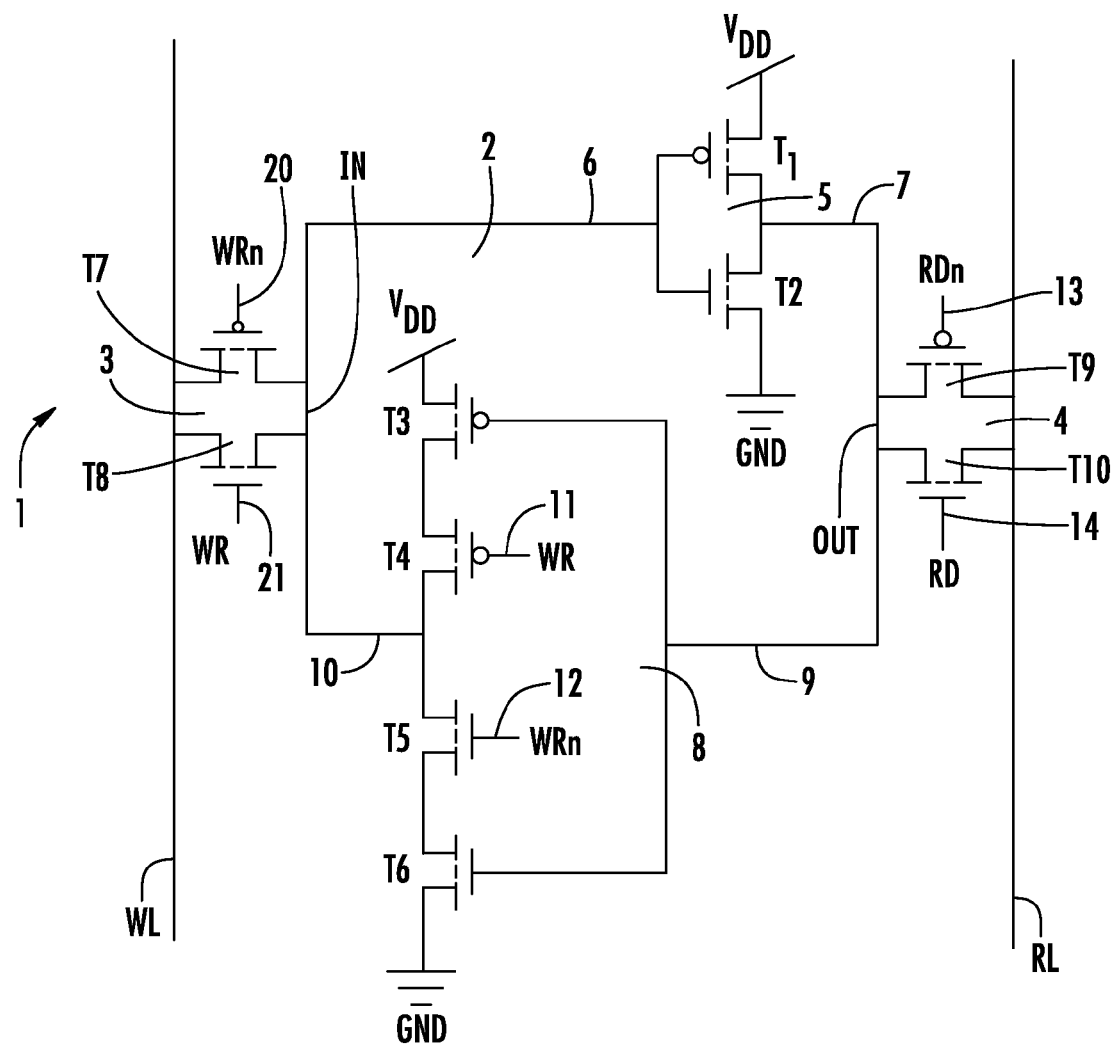
FIG. 1 illustrates a memory base cell according to an example of the invention, from a circuit point of view.

With reference to the aforementioned figures, it should be noted that, for the sake of simplicity, common and analogous elements are indicated with the same reference numerals.

With particular reference to the FIG. 1, a memory base cell is described, wholly indicated with reference numeral 1, according to a first example of the invention.

The memory base cell 1 comprises a plurality of n basic cells, for example five, each including a P-channel MOS transistor and an N-channel NMOS transistor, arranged with the gate terminals vertical and the active areas horizontal with respect to a plane of reference. Each of the basic cells is arranged with respect to its adjacent cells so that the combination of the plurality of adjacent cells builds a so-called sea of gate structure, with high regularity.

Figure 5:
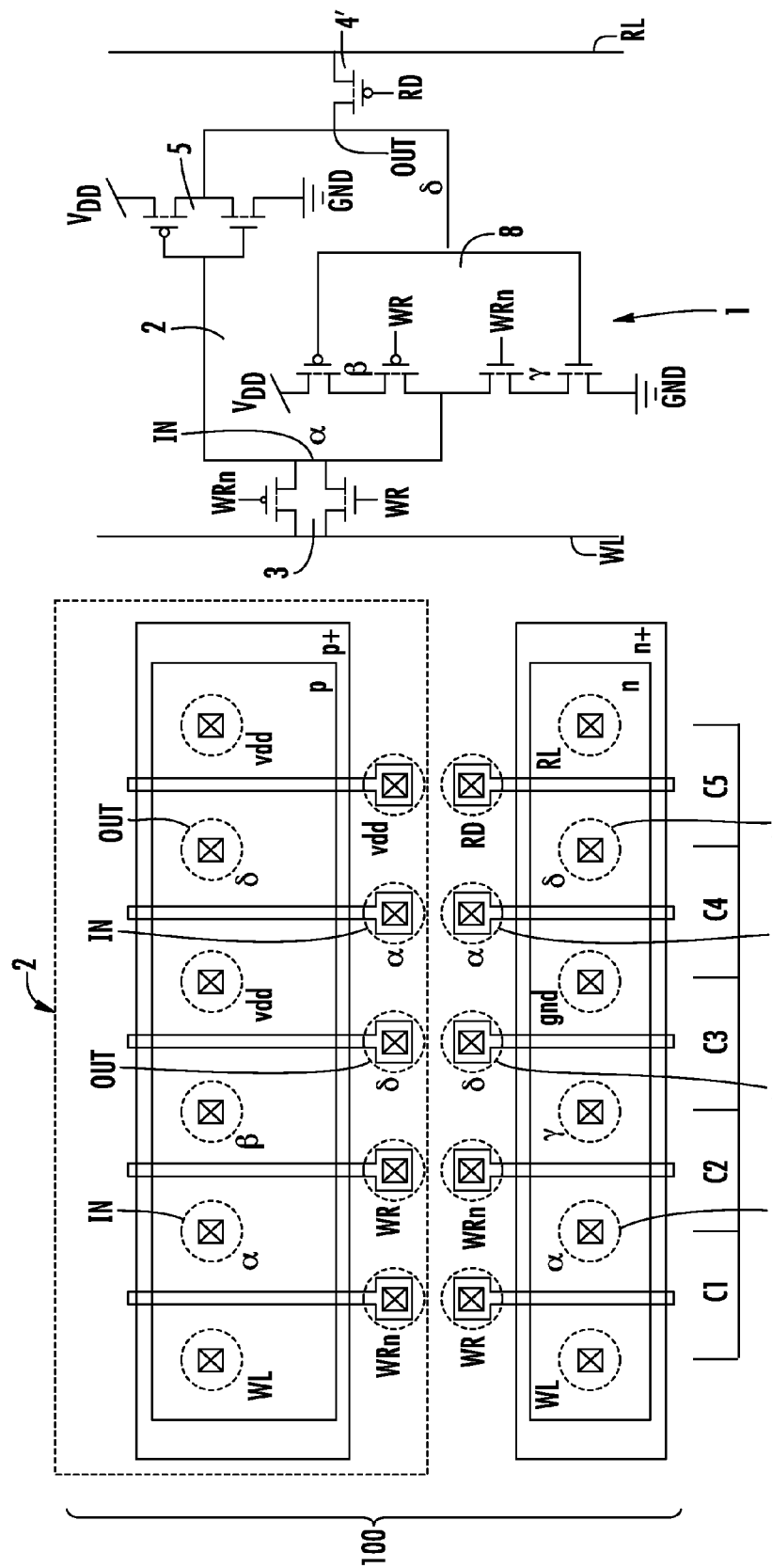
FIG. 5 schematically illustrates a layout structure of the memory base cell of the example of FIG. 2 alongside the memory base cell of FIG. 2 to highlight the arrangement of the terminals of the memory base cell of FIG. 2 in the respective layout as contacts.
Figure 6:
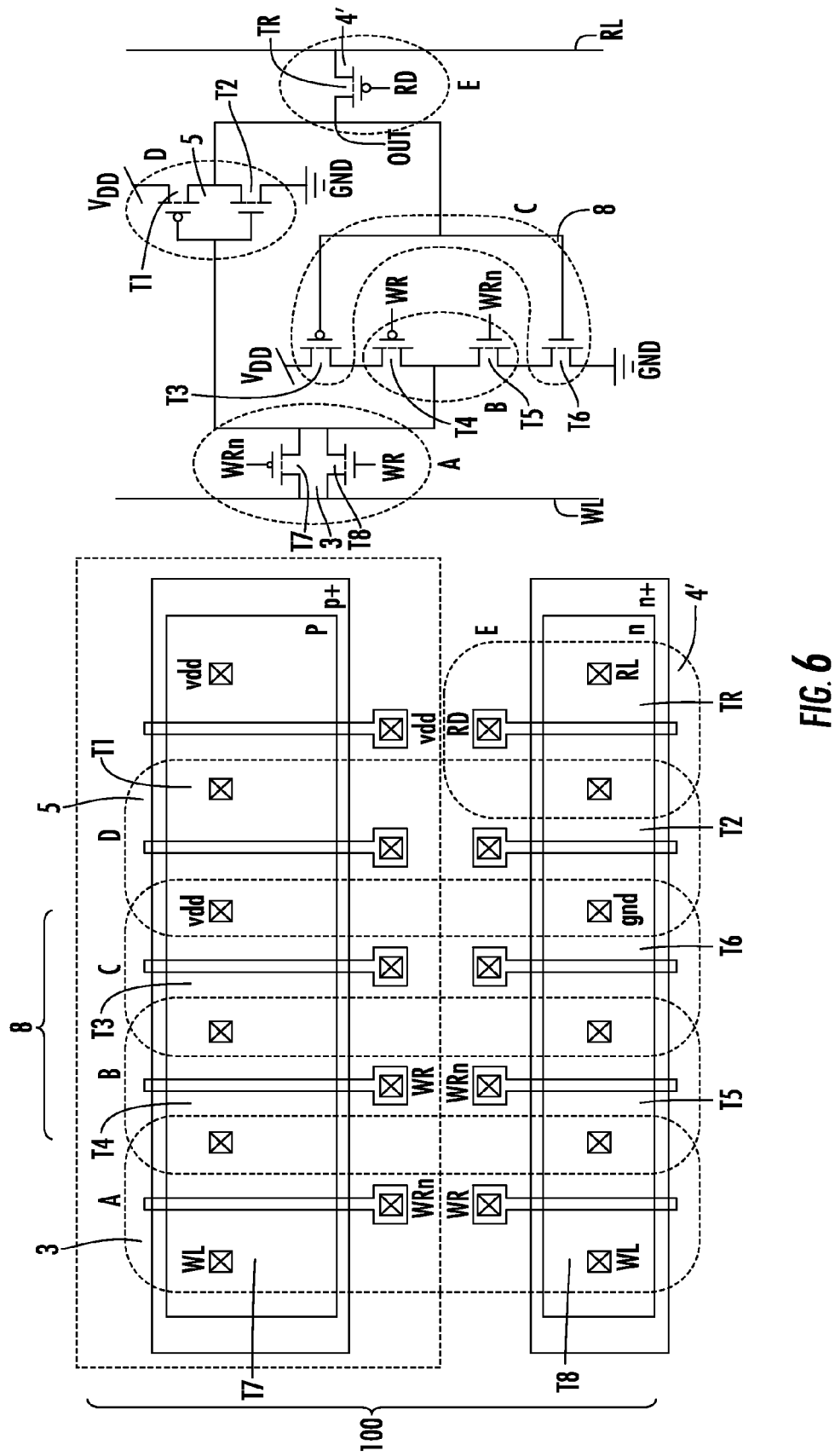
FIG. 6 schematically illustrates the layout structure of FIG. 4 alongside the memory base cell of FIG. 2 to highlight the arrangement of the transistors used to build the memory base cell of FIG. 2 in the respective layout.

An example of a sea of gate structure that can also be used to make the memory base cell 1 is shown from the layout structure of FIGS. 5 and 6. Indeed, it should be kept in mind that the layout structure of FIGS. 5 and 6 refers to a memory base cell according to a further example of the invention that will be described hereafter.

Going back to the example of FIG. 1, the memory base cell 1 is built from a sea of gate structure comprising a plurality of five basic cells of the type described earlier. Therefore, the memory base cell 1 of FIG. 1 comprises five N-channel MOS transistors having the same first channel width W1 and five P-channel MOS transistors having the same second channel width W2, but different from the first channel width W1.

The plurality of transistors of the sea of gate structure forming the memory base cell 1 is arranged, through suitable metal electrical connections between the single transistors, so as to define the logic elements for implementing the memory base cell 1, as described hereafter.

Such a memory base cell 1 comprises a bistable element 2 for storing one bit of information having an input node IN operatively connected to a writing data line WL of the memory base cell 1 and an output node OUT operatively connected to a reading data line RL of the memory base cell 1. In particular, the memory base cell 1 also comprises an input transfer element 3 and an output transfer element 4. The input transfer element 3 is arranged to operatively connect the bistable element 2 to the writing data line WL. The output transfer element 4 is arranged to operatively connect the bistable element 2 to the reading data line RL.

Moreover, the bistable element 2 comprises a first inverter 5 having a respective input terminal 6 operatively connected to the input node IN of the bistable element 2 and a respective output terminal 7 operatively connected to the output node OUT of the bistable element 2.

Furthermore, the bistable element 2 also comprises a second inverter 8 having a respective input terminal 9 operatively connected to the output node OUT of the bistable element 2 and consequently to the output terminal 7 of the first inverter 5 and a respective output terminal 10 operatively connected to the input node IN of the bistable element 2 and consequently to the input terminal 6 of the first inverter 5. Therefore, the first inverter 5 and the second inverter 8 are arranged so as to be in a feedback connection with one another between the input node IN and the output node OUT of the bistable element 2.

Again with reference to FIG. 1, from a circuitry point of view, the first inverter 5 is, for example, an inverter in CMOS technology, comprising a first transistor T1 of the P-channel MOS type and a second transistor T2 of the N-channel MOS type. The gate terminals of the first transistor T1 and of the second transistor T2, connected together, represent the input terminal 6 of the first inverter 5. The drain terminals of the first transistor T1 and of the second transistor T2, connected together, represent the output terminal 7 of the first inverter 5. The source terminal of the first transistor T1 is electrically connected to a first reference potential VDD, which can be defined as upper power supply potential of the circuit. The source terminal of the second transistor T2 is electrically connected to a second reference potential GND, which can be defined as lower power supply potential of the circuit, for example ground.

Again from a circuitry point of view, the second inverter 8 includes a tristate inverter in CMOS technology, comprising a first transistor T3 of the P-channel MOS type, a second transistor T4 of the P-channel MOS type, a third transistor T5 of the N-channel MOS type and a fourth transistor T6 of the N-channel MOS type. The gate terminals of the first transistor T3 and of the fourth transistor T6 of the second inverter 8, connected together, represent the input terminal 9 of the second inverter 8. The drain terminals of the second transistor T4 and of the third transistor T5 of the second inverter 8, connected together, represent the output terminal 10 of the second inverter 8. The first transistor T3 of the second inverter B has the respective source terminal electrically connected to the first reference potential VDD and the respective drain terminal electrically connected to the source terminal of the second transistor T4 of the second inverter 8. The fourth transistor T6 of the second inverter 8 has the respective source terminal electrically connected to the second reference potential GND and the respective drain terminal electrically connected to the source terminal of the third transistor T5 of the second inverter 8.

Going back in general to the second inverter 8 of the bistable element 2, it comprises a first writing enabling terminal 11 of the memory base cell 1 to receive in input a respective writing enabling logic signal WR and a second writing enabling terminal 12 to receive in input the writing enabling denied logic signal WRn. From a circuitry point of view, the first writing enabling terminal 11 is the gate terminal of the second transistor T4 of the second inverter 8 of the bistable element 2. The second writing enabling terminal 12 is the gate terminal of the third transistor T5 of the second inverter 8.

Again from a circuitry point of view, the input transfer element 3 comprises a first transistor T7 of the P-channel MOS type and a second transistor T8 of the N-channel MOS type arranged in pass transistor configuration, to allow the writing of the bit of information from the writing data line WL to the memory base cell 1.

In particular, the first transistor T7 of the input transfer element 3 has a respective control terminal 20 (gate terminal) arranged to receive the writing enabling denied logic signal WRn and the (drain and source) terminals electrically connected to the input node IN of the bistable element 2 and to the writing data line WL so that the first transistor T7 of the input transfer element 3 is in pass transistor configuration.

The second transistor T8 of the input transfer element 3 has a respective control terminal 21 (gate terminal) arranged to receive the writing enabling logic signal WR and the (drain and source) terminals electrically connected to the input node IN of the bistable element 2 and to the writing data line WL so that the second transistor T8 of the input transfer element 3 is in pass transistor configuration.

From a logic point of view, the input transfer element 3 makes it possible to transfer the bit of information to be written in the memory base cell 1 from the writing data line WL to the bistable element 2 based on the writing enabling logic signal WR (writing phase of the memory base cell 1).

Going back to the second inverter 8 of the bistable element 2, it should be noted that it comprises the first writing enabling terminal 11 to receive the writing enabling logic signal WR and the second writing enabling terminal 12 to receive the writing enabling denied logic signal WRn so that the second inverter 8 of the bistable element 2 is disabled for writing when the input transfer element 3 is enabled for writing the bit of information.

On the other hand, with regard to the output transfer element 4, from a circuitry point of view, it comprises, analogously to the input transfer element 3, a first transistor T9 of the P-channel MOS type and a second transistor T10 of the N-channel MOS type arranged in pass transistor configuration, to allow the reading of the bit of information stored in the writing phase inside the memory base cell 1.

In particular, the first transistor T9 of the output transfer element 4 has a respective control terminal 13 (gate terminal) arranged to receive the reading enabling denied logic signal RDn and the other (drain and source) terminals electrically connected to the output node OUT of the bistable element 2 and to the reading data line RL so that the first transistor T9 of the output transfer element 4 is in pass transistor configuration.

The second transistor T10 of the output transfer element 4 has a respective control terminal 14 (gate terminal) arranged to receive in input a reading enabling logic signal RD and the other (drain and source) terminals electrically connected to the output node OUT of the bistable element 2 and to the reading data line RL so that also the second transistor T10 of the output transfer element 4 is in pass transistor configuration.

From a logic point of view, the output transfer element 4 makes it possible to transfer the bit of information from the memory base cell 1, from the bistable element 2 in which it was stored, to the reading data line RL based on the reading enabling logic signal RD (reading phase of the memory base cell 1).

Going back in general to the memory base cell 1 as described (FIG. 1), it should be noted that by using the writing enabling logic signal WR and the writing enabling denied logic signal WRn both to control the input transfer element 3 and to control the second inverter 8, it makes it possible to open the memory base cell 1 to writing actually disabling the second (tristate) inverter 8 to advantageously avoid sizing in ratio of the plurality of transistors that form the memory base cell 1. In other words, in a memory base cell 1 of the example of FIG. 1, the sizing of the W/L ratio is not helpful since such a ratio is the same for all homologous transistors, P-channel and N-channel respectively, and it is fixed by the particular implementation of the base element of the aforementioned sea of gate structure.

Now with reference to FIG. 2, a memory base cell according to a further example of the invention, wholly indicated with reference numeral 1', comprises a bistable element 2 and an input transfer element 3 analogous to those described with reference to the example of FIG. 1. Regarding this, FIG. 2 for the sake of completeness uses the same main reference numerals and alphanumeric references already used in FIG. 1 to indicate analogous elements between the memory base cell 1 of FIG. 1 and the further memory base cell 1' of FIG. 2.

Figure 2:
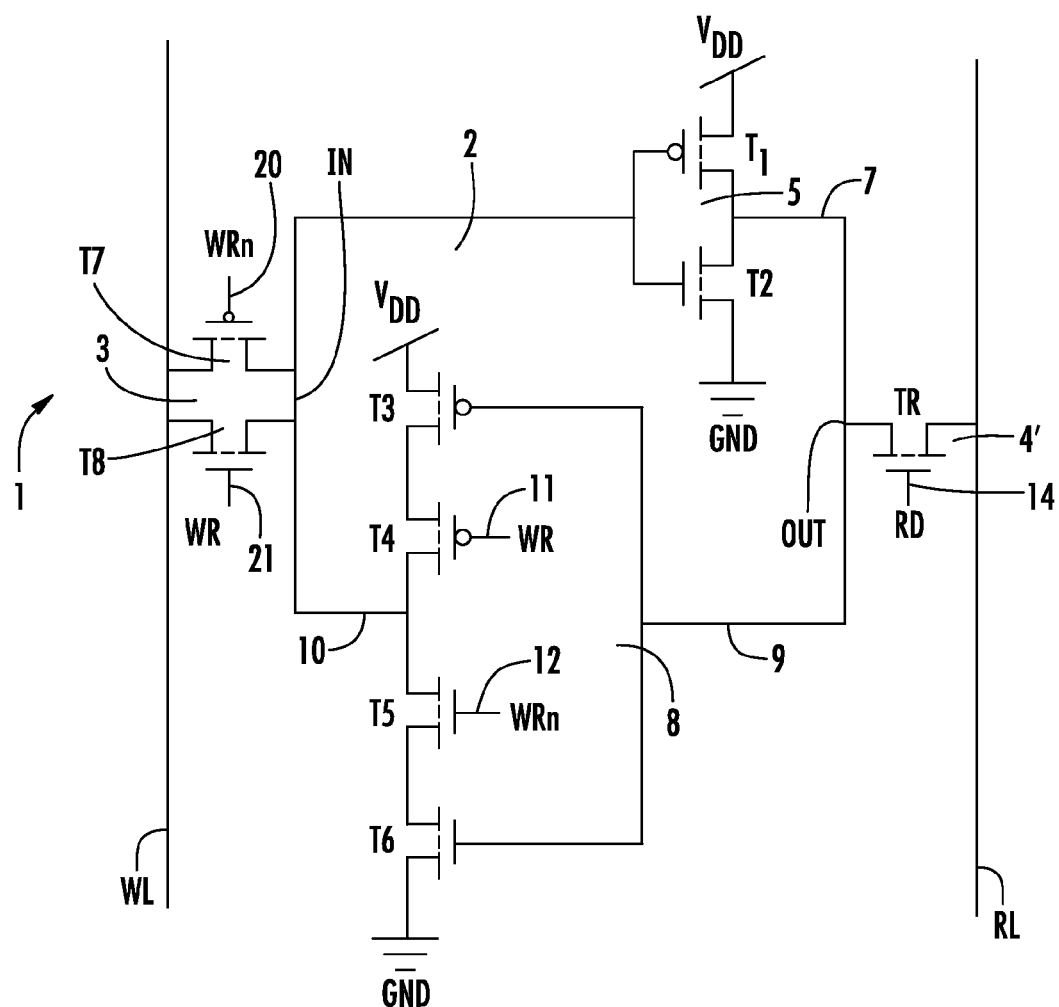
FIG. 2 illustrates a memory base cell according to a further example of the invention, from a circuit point of view.

With particular reference now to FIG. 2, the memory base cell 1' comprises an output transfer element 4' arranged between the output node OUT of the bistable element 2 and the reading data line RL that is different from the one indicated in the example of FIG. 1. Indeed, such an output transfer element 4' comprises a single transistor TR of the N-channel MOS type arranged in pass transistor configuration.

In particular, the transistor TR' of the output transfer element 4' has a respective control terminal 15 (gate terminal) arranged to receive a reading enabling signal RD totally analogous to the one used in the memory base cell 1 of FIG. 1 and the respective other (drain and source) terminals electrically connected to the output node OUT of the bistable element 2 and to the reading data line RL so that such a transistor is in pass transistor configuration.

In this particular example of the invention, the presence of a single pass transistor (transistor TR) entails the use of a so-called precharging mechanism of the reading line (not shown in FIG. 2) combined with the transistor TR of the output transfer element 4'. In this way it is advantageously possible to obtain an adequate stability margin of the memory base cell 1, for example with respect to the embodiment described with reference to FIG. 1.

Indeed, with regard to the output transfer element 3 of the example of FIG. 1, it should be noted that the use of two transistors (T9 and T10), in pass transistor configuration respectively controlled by a reading enabling signal RD and a reading enabling denied signal RDn, advantageously makes it possible to avoid the use of precharging of the line RL during reading of the data, but it entails a potential problem relating to the stability margin of the memory base cell 1.

Contrarily, in reference to the output transfer element 3 of the example of FIG. 2, the use of a single transistor (TR), in pass transistor configuration controlled by a reading enabling signal RD, advantageously makes it possible to maintain an adequate stability margin of the memory base cell, although it entails the use of a precharging mechanism of the line RL during the data reading phase.

Moreover, based on what has been indicated, the memory base cell 1 is not configured like a standard SRAM memory base cell but rather like a latch type circuit with an input transfer element and an output transfer element preferably optimised to reduce the area occupied by the memory base cell and the load on the writing and reading data lines, respectively.

In fact, the example embodiment of FIG. 1 can also be defined a pre-charging-free memory base cell whereas the further example embodiment of the memory base cell of FIG. 2 can be defined as one with precharging. For both the examples of FIG. 1 and FIG. 2, the memory base cell 1 has the writing data line WL and the reading data line RL distinct from one another but still shared between adjacent memory cells to advantageously reduce the area occupied by each memory base cell.

Figure 3:
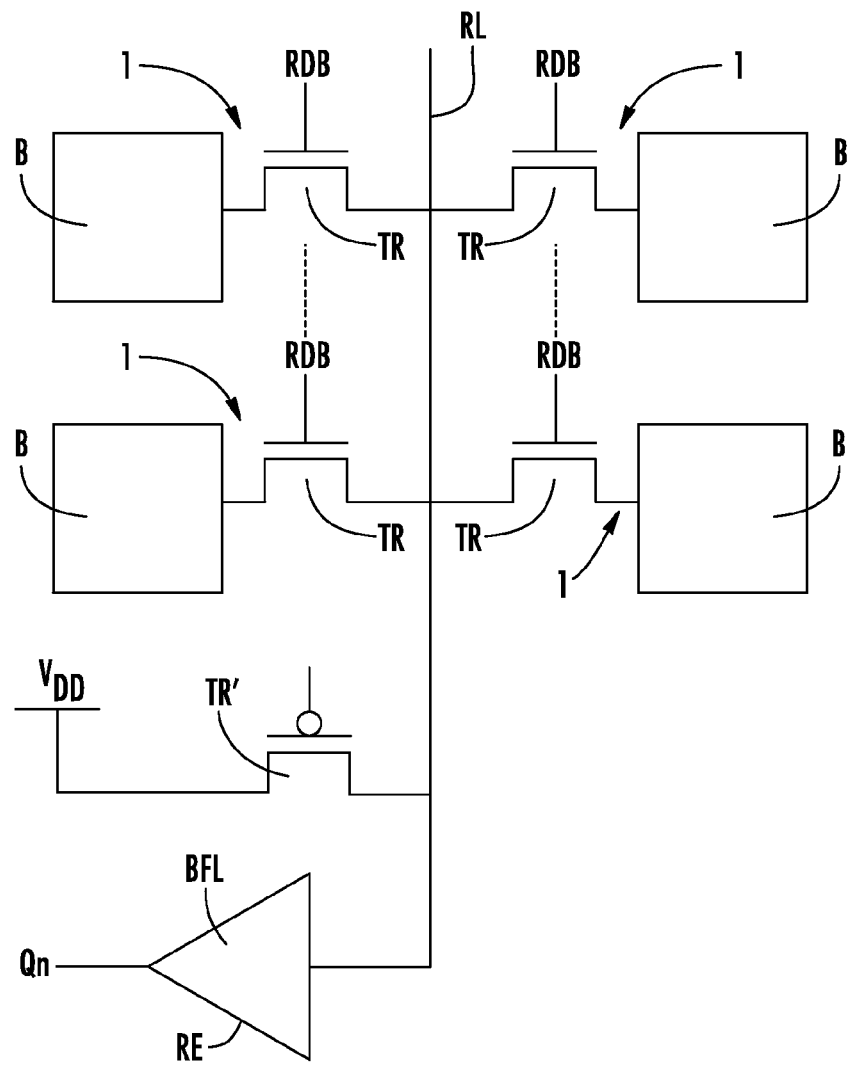
FIG. 3 schematically illustrates a precharging mechanism of the reading data line of memory base cells of the type shown in the example of FIG. 2, from a logic point of view.

Regarding this, FIG. 3 shows, from the logic point of view, an example of precharging mechanism of a reading line, again indicated with reference letters RL, of a plurality of memory base cells totally analogous to the memory base cell 1 of FIG. 2, all indicated in FIG. 3 with the same reference numeral 1. Each of the memory base cells 1 is schematically represented by a block B including both the bistable element for storing the bit of information and the input transfer element (not shown in the figure). Each block B is operatively connected to the reading data line RL through a respective transistor of the N-channel MOS type in pass transistor configuration in a totally analogous manner to the transistor TR described earlier with reference to FIG. 2, again indicated for the sake of simplicity with reference letters TR. Each of the pass transistors TR shown in FIG. 3 is controlled by a respective reading enabling signal RDB.

The precharging mechanism of the reading data line RL comprises a further transistor TR' of the P-channel MOS type in pass transistor configuration electrically connected between the first reference potential VDD and the reading data line RL, having a respective control terminal to receive a precharging enabling denied signal PREn, which enables the precharging (for example to the value VDD) of the reading line RL during the precharging phase, to then switch off during the evaluation phase and thus allow the data to actually be read by the memory base cell.

Moreover, such a precharging mechanism of the reading data line RL of FIG. 3 comprises a tristate buffer BFL arranged to receive in input the reading data line RL and provide in output a logic signal Qn representative of the value contained in the open memory cell being read based on a reading enabling signal of the column RE (Read Enable).

From an operational point of view, the precharging phase of the reading line RL occurs when the reference clock logic signal of the memory bank comprising the plurality of memory base cells is at high level. In this condition the reading data line RL is forced to the first reference potential VDD (upper power supply potential of the circuit) and the memory base cells 1 are closed since on the control terminals of the respective pass transistors TR there is a respective zero enabling signal (RDB=0).

During a subsequent reading phase (evaluation phase), at a level of the reference clock signal equal to the second reference potential GND, the further pass transistor TR' of the precharging mechanism is disabled, the reading data line RL discharges to the value equal to the second reference potential GND if in the memory base cell 1 currently open for reading (TR open) there is a bit of information equal to 0 or else it stays at the precharging value equal to the first reference potential VDD if in the memory base cell 1 there is a bit of information equal to 1. Such a value present on the reading data line RL passes through the tristate buffer BFL (enabled by the control signal RE) to the output of the memory.

Each reading data line RL is connected to a tristate buffer totally analogous to the tristate buffer BFL. According to which reading data line RL is being addressed, a single tristate buffer is enabled to transfer the datum of the memory base cell read in output.

Now with reference to FIG. 4, a writing phase of a plurality of memory base cells will be described (in FIG. 4 only a first and second of which are shown, respectively indicated with reference numerals 1' and 1") that is totally analogous to the memory base cell of the example of FIG. 1 or to the memory base cell of the further example of FIG. 2, described earlier.

In particular, the first memory base cell 1' and the second memory base cell 1" both comprise a respective bistable element 2 including a first inverter 5 and a second inverter 8 arranged in feedback with one another in a configuration according to a latch type approach. Each bistable element 2 is operatively connected to the writing data line WL by a respective input transfer element 3.

In each memory base cell, both the input transfer element 3 and the second inverter 8 are intended to receive the same writing enabling signal, indicated with enl' for the memory base cell indicated with 1' and indicated with enl" for the memory base cell indicated with 1". On the writing data line there is an external control buffer BFW, the sizing of which is not critical.

Figure 4:
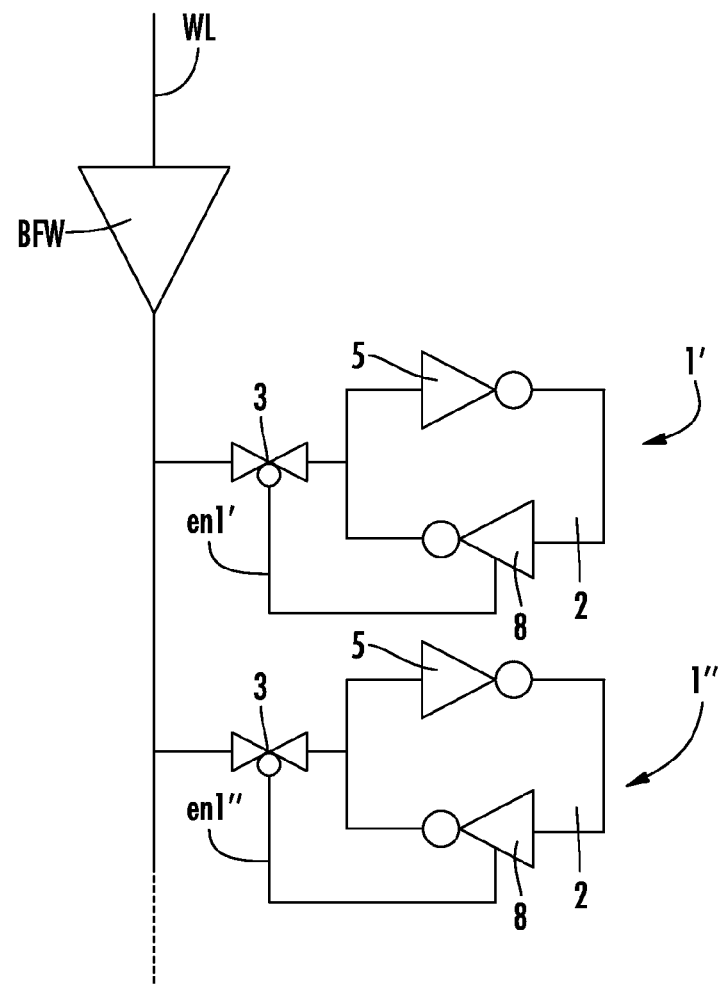
FIG. 4 schematically illustrates a writing line of two memory base cell of the type shown in the example of FIG. 1 or in the further example of FIG. 2, from a logic point of view.

With reference to FIG. 4, just like FIGS. 1 and 2, it emerges from the designs proposed according to the examples described that the second (tristate) inverter of the memory base cell is disabled during the writing phase (enabling of the input transfer element) actually allowing a logic without ratio of the transistors used, using dedicated writing enabling signals and a latch type configuration approach.

It should also be noted that in the configuration proposed in the described examples, the length of the writing data line WL is not critical since during writing the second tristate inverter B of the memory base cell 1 is disabled, and therefore if the external control buffer BFW is able to control the writing data line WL, the datum will be written correctly inside the memory base cell 1. In the case in which a longer writing data line is used, it would be necessary to simply use a larger external control buffer BFW, without acting in the slightest upon the memory base cells 1.

FIG. 5 shows a layout of a sea of gate structure, wholly indicated with reference numeral 100, representative of a memory base cell 1 of the example of FIG. 2, for the sake of practicality once again shown beside the layout 100 also in FIG. 5, to highlight in the layout 100 the arrangement of the contact terminals of the memory base cell 1 of FIG. 2. In particular it should be noted that the connections called "IN", or "α", and "OUT", or "δ", subtend 4 different contacts (2 gate terminals and 2 source/drain terminals), as can clearly be seen from layout 100.

As shown, the memory base cell 1 is built from five identical basic cells, which constitute the sea of gate structure, indicated in the figure with c1, c2, c3, c4 and c5, respectively.

For example, in an embodiment, each of the basic cells c1, c2, c3, c4 and c5 represents a basic base cell for implementing an Engineering Change Order (ECO). In particular, each basic base cell has a symmetrical structure with respect to a virtual central reference axis, with respect to which the diffusion areas and the areas of the installation of material layers substantially mirror one another.

Advantageously, each basic base cell ECO has a width equal to the minimum pitch, i.e. it has a pitch equal to that of the minimum standard library cell implemented in the technology in question. In this way, each basic base cell of FIG. 5 can be connected to the other basic base cells of the layout to obtain the memory base cell according to the invention optimising the overall area occupied by the circuit.

Moreover, it should be observed that the basic cells c1, c2, c3, c4 and c5 the form the memory base cell of the example of the invention have the respective P+ and N+ diffusion layers shared and the respective P and N active regions shared.

Such shared layers form respective overall diffusion layers and respective overall active regions. Therefore, the diffusion masks and the masks of the active regions used in the process integrated on silicon are regular.

It should be noted that, as well as making the memory base cell of the invention, the basic base cells (c1, c2, c3, c4 and c5) of the example of layout of FIG. 5 can be connected to one another and with other clusters of basic base cells so as to implement complex logic functions, like for example NAND, NOR, Flip Flop and Latch.

FIG. 6 illustrates the layout of the sea of gate structure 100 representative of the memory base cell 1 of the example of FIG. 2, for the sake of practicality shown once again in FIG. 6, to highlight in the layout 100 the arrangement of the transistors used to build the memory base cell 1 of FIG. 2.

In particular, in FIG. 6 reference letter A indicates the pair of transistors forming the input transfer element 3, reference letter B indicates the central pair of transistors of the second inverter 8 controlled by the writing enabling signal WR and by the writing enabling denied signal WRn, reference letter C indicates the outer pair of transistors of the second inverter 8 connected to the output node OUT of the bistable element 2, reference letter D indicates the pair of transistors forming the first inverter 5 of the bistable element 2, and reference letter E indicates the single transistor forming the output transfer element 4'.

Figure 7:
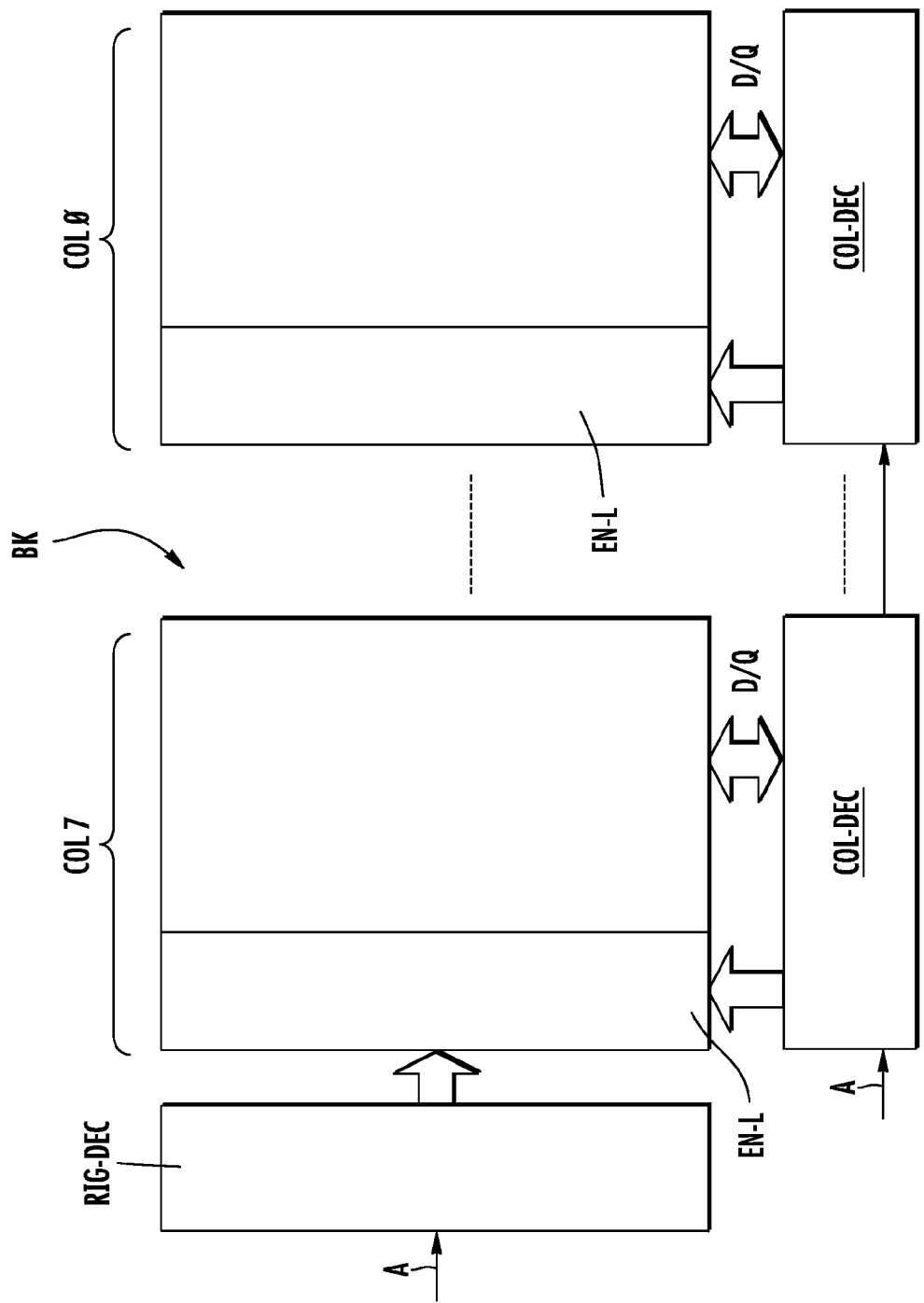
FIG. 7 schematically illustrates a block diagram of a memory bank inside which a plurality of memory base cells according to the example of FIG. 1 or the example of FIG. 2 is implemented.

With reference to FIG. 7, a memory bank shall now be described, wholly indicated with reference numeral BK, comprising a plurality of memory base cells in which each memory base cell is totally analogous to the one described in reference to one of the examples of the invention of FIG. 1 or of FIG. 2.

The plurality of memory base cells is distributed along a plurality of columns (COL0-COL7) and a plurality of lines. In the example of FIG. 7, the memory bank BK can be arranged to store 128 words of 8 bit each (1 Kbit memory bank BK), for a total of 1024 bit corresponding to 1024 memory base cells like those described in reference to one of the examples of the invention of FIG. 1 or FIG. 2.

From an architectural point of view, the single 8-bit words are grouped in 8 columns COL7-COL0 addressed by a respective decoder COL-DEC 3×8. Every column therefore comprises 16 words of 8 bit each organised in 16 lines addressed by a respective decoder RIG-DEC 4×16.

Therefore, the memory bank BK comprises a plurality of line decoders RIG-DEC to address a line to select a predetermined memory base cell and a plurality of column decoders (COL-DEC) to address a column to select the predetermined memory base cell.

It should be noted that the 16 elements of each column are organized so as to share the writing data lines WL and the reading data lines RL of adjacent memory base cells, to obtain an advantageous reduction of area occupied by the memory bank BK.

Moreover, this type of configuration advantageously makes it possible to use distinct decoders (COL-DEC and RIG-DEC) for column and line, respectively, actually reducing the complexity and the time required for each decoding. Given that just one memory base cell may to be able to be open individually in writing at a given moment, every column COL0-COL7 comprises a respective enabling logic EN-L intended to enable the writing signals for the memory cells addressed based on the values provided, respectively, by the line decoder RIG-DEC and by the column decoder COL-DEC.

It should also be noted that in accordance with the purpose of the present invention, the entire decoding logic, made up of a plurality of line decoders RIG-DEC and column decoders COL-DEC, is implemented using the same sea of gate structure already described for the memory base cell, thus ensuring the complete homogeneity of the base architecture of the memory.

With regard to the interface with external devices, the memory bank BK also comprises a writing port D of the plurality of memory base cells, a reading port Q of the plurality of memory base cells, an address bus A to address a memory base cell and a control bus to select the operation to be carried out (writing or reading) on the memory base cell addressed.

With regard to the logic inputs of the memory bank BK, it should be noted that they are synchronous with respect to a reference clock signal provided from the outside to avoid combination paths between inputs and outputs. It should also be observed that the memory bank BK can thus advantageously be extended both in number of words and in size of the word through replication and composition of the single banks.

In particular, a further programmable decoding level can be added that makes it possible to compose the banks in an automated manner through a generation flow of memory sizes. Based on the composition of the decoders and the position and number of 1 Kbit memory banks used, it is possible to make memory sizes up to 4 Kbyte with word size equal to 8, 16 or 32 bit.

Finally, this type of memory bank can also be extended to make a 2 port type memory with a reading port Q and a writing port D that are distinct from one another and synchronised over two independent external reference clock signals. Moreover, by using two distinct addresses for the writing port and the reading port, it is advantageously possible to carry out a reading operation of a memory cell while a writing operation is carried out on another memory cell, distinct from the previous one. It should be noted that also in this case the base memory size can be used to generate different memory sizes through an automated script.

As can be seen, the purpose of the invention is fully accomplished since the memory base cell according to the example embodiments described, as also indicated earlier, has a homogeneous base architecture based on a sea of gate approach, a consequent greater flexibility and ease of integration with respect to the standard cells described with reference to the prior art and it takes up relatively reduced area considering the type of architecture selected.

Moreover, the fact that NMOS and PMOS type transistors of fixed dimensions are used both for the memory cell and for the decoding logic makes it possible to obtain an increase in regularity. Finally, the use of a sea of gate structure to form a memory base cell substantially reduces the masking costs borne in the manufacturing process of the memory base cell.

Furthermore, it should be noted that the memory base cell described is implemented from a highly regular and compact structure made up of multiple identical and replicated base elements, on the sea of gate structure model, in which the base element of the structure is a cell able to be configured with minimum width in relation to the particular technology used.

Moreover, it should be noted that the output transfer element implemented, based on the same regular structure in which the memory base cell is obtained, is obtained so as to form a continuous and homogeneous structure with the memory base cell.

Finally, it should be noted that the decoding logic of the memory bank described comprising the plurality of line decoders (RIG-DEC) and the plurality of column decoders (COL-DEC) are implemented based on the same regular structure so as to advantageously form a continuous and homogeneous structure with the memory base cell.

In an analogous manner, the enabling logic of each column of the plurality of columns of the memory bank is advantageously implemented based on the same regular structure so as to also form a continuous and homogeneous structure with the memory bank.

A man skilled in the art can bring modifications, adaptations and replacements of elements with other functionally equivalent ones to the embodiments of the memory base cell described above, to satisfy contingent requirements, without departing from the scope of the following claims. Each of the characteristics described as belonging to a possible embodiment can be made independently from the other embodiments described.

That which is claimed:

1. A memory base cell configured to store at least one bit of information, comprising:
   a writing data line and a reading data line;
   a bistable element comprising an input node operatively coupled to the writing data line, an output node operatively coupled to the reading data line, and a first inverter and a second inverter arranged in a feedback configuration with respect to one another between the input node and the output node;
   an input transfer element operatively coupled between the writing data line and the input node of the bistable element configured to transfer a bit of information from the writing data line to the bistable element, the input transfer element comprising a first control terminal configured to receive a writing enabling logic signal, and a second control terminal configured to receive a writing enabling denied logic signal;
   the second inverter of the bistable element comprising a first writing enabling terminal configured to receive the writing enabling logic signal and a second writing enabling terminal configured to receive the writing enabling denied logic signal so that the second inverter of the bistable element is disabled for writing when the input transfer element is enabled for writing the bit of information.

2. A memory base cell according to claim 1, further comprising an output transfer element operatively coupled between the output node of the bistable element and the reading data line and configured to transfer a bit of information from the bistable element to the reading data line, the outer transfer element comprising a respective control terminal configured to receive a reading enabling logic signal.

3. A memory base cell according to claim 2, wherein the output transfer element further comprises a second control terminal configured to receive a reading enabling denied logic signal.

4. A memory base cell according to claim 1, wherein the second inverter comprises a tristate inverter.

5. A memory base cell according to claim 1, wherein the input transfer element comprises at least one pass transistor.

6. A memory base cell according to claim 2, wherein the output transfer element comprises at least one pass transistor.

7. A memory bank having a plurality of memory base cells distributed along a plurality of columns and a plurality of lines, the memory bank comprising:
 a plurality of line decoders configured to address a line to select a given memory base cell;
 a plurality of column decoders configured to address a column to select the given memory base cell;
 a writing port for the plurality of memory base cells;
 a reading port for the plurality of memory base cells;
 an address bus configured to address the plurality of memory base cells;
 a control bus configured to select an operation to be carried out on an addressed memory base cell of the plurality thereof;
 each memory base cell of the plurality thereof comprising
 a writing data line and a reading data line;
 a bistable element comprising an input node operatively coupled to the writing data line, an output node operatively coupled to the reading data line, and a first inverter and a second inverter arranged in a feedback configuration with respect to one another between the input node and the output node,
 an input transfer element operatively coupled between the writing data line and the input node of the bistable element and configured to transfer a bit of information from the writing data line to the bistable element, the input transfer element comprising a first control terminal configured to receive a writing enabling logic signal, and a second control terminal configured to receive a writing enabling denied logic signal,
 the second inverter of the bistable element comprising a first writing enabling terminal configured to receive the writing enabling logic signal and a second writing enabling terminal configured to receive the writing enabling denied logic signal so that the second inverter of the bistable element is disabled for writing when the input transfer element is enabled for writing the bit of information.

8. A memory bank according to claim 7, wherein each column of the plurality of columns comprises a respective enabling logic configured to generate the writing signals for a memory base cell based on values provided, respectively, by the respective line decoder and by the respective column decoder.

9. A memory bank according to claim 7, further comprising an output transfer element operatively coupled between the output node of the bistable element and the reading data line and configured to transfer a bit of information from the bistable element to the reading data line, the outer transfer element comprising a respective control terminal configured to receive a reading enabling logic signal.

10. A memory bank according to claim 9, wherein the output transfer element further comprises a second control terminal configured to receive a reading enabling denied logic signal.

11. A memory bank according to claim 7, wherein the second inverter comprises a tristate inverter.

12. A memory bank according to claim 7, wherein the input transfer element comprises at least one pass transistor.

13. A memory bank according to claim 9, wherein the output transfer element comprises at least one pass transistor.

14. A method of making a memory base cell for storing at least one bit of information, comprising:
 coupling an input node of a bistable element to a writing data line, and coupling an output node of the bistable element to a reading data line;
 arranging a first inverter and a second inverter of the bistable element in a feedback configuration with respect to one another between the input node and the output node;
 coupling an input transfer element between the writing data line and the input node of the bistable element to transfer a bit of information from the writing data line to the bistable element, the input transfer element comprising a first control terminal to receive a writing enabling logic signal, and a second control terminal to receive a writing enabling denied logic signal;
 the second inverter of the bistable element comprising a first writing enabling terminal to receive the writing enabling logic signal and a second writing enabling terminal to receive the writing enabling denied logic signal so that the second inverter of the bistable element is disabled for writing when the input transfer element is enabled for writing the bit of information.

15. A method according to claim 14, further comprising coupling an output transfer element between the output node of the bistable element and the reading data line to transfer a bit of information from the bistable element to the reading data line, the outer transfer element comprising a respective control terminal to receive a reading enabling logic signal.

16. A method according to claim 15, wherein the output transfer element further comprises a second control terminal to receive a reading enabling denied logic signal.

17. A method according to claim 14, wherein the second inverter comprises a tristate inverter.

18. A method according to claim 14, wherein the input transfer element comprises at least one pass transistor.

19. A method according to claim 14, wherein the output transfer element comprises at least one pass transistor.

* * * * *